United States Patent
Yang et al.

(10) Patent No.: US 10,505,034 B2
(45) Date of Patent: Dec. 10, 2019

(54) VERTICAL TRANSISTOR USING A THROUGH SILICON VIA GATE

(71) Applicant: Intel Corporation, Santa Clara, CA (US)

(72) Inventors: Xiaodong Yang, Portland, OR (US); Jui-Yen Lin, Hillsboro, OR (US); Kinyip Phoa, Beaverton, OR (US); Nidhi Nidhi, Hillsboro, OR (US); Yi Wei Chen, Hillsboro, OR (US); Kun-Huan Shih, Portland, OR (US); Walid M. Hafez, Portland, OR (US); Curtis Tsai, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/573,110

(22) PCT Filed: Jun. 19, 2015

(86) PCT No.: PCT/US2015/036797
§ 371 (c)(1),
(2) Date: Nov. 9, 2017

(87) PCT Pub. No.: WO2016/204794
PCT Pub. Date: Dec. 22, 2016

(65) Prior Publication Data
US 2018/0130902 A1    May 10, 2018

(51) Int. Cl.
*H01L 29/78* (2006.01)
*H01L 29/06* (2006.01)
(Continued)

(52) U.S. Cl.
CPC ........ *H01L 29/7813* (2013.01); *H01L 23/481* (2013.01); *H01L 29/0653* (2013.01);
(Continued)

(58) Field of Classification Search
None
See application file for complete search history.

(56) References Cited

U.S. PATENT DOCUMENTS

| | | |
|---|---|---|
| 2002/0030210 A1 | 3/2002 | Matsui et al. |
| 2002/0093074 A1 | 7/2002 | Bertin et al. |

(Continued)

FOREIGN PATENT DOCUMENTS

WO    WO 2012144951    10/2012

OTHER PUBLICATIONS

International Preliminary Report on Patentability for International Patent Application No. PCT/US2015/036797 dated Dec. 28, 2017, 11 pages.

(Continued)

*Primary Examiner* — Zandra V Smith
*Assistant Examiner* — Lawrence C Tynes, Jr.
(74) *Attorney, Agent, or Firm* — Schwabe, Williamson & Wyatt, P.C.

(57) ABSTRACT

A vertical transistor is described that uses a through silicon via as a gate. In one example, the structure includes a substrate, a via in the substrate, the via being filled with a conductive material and having a dielectric liner, a deep well coupled to the via, a drain area coupled to the deep well having a drain contact, a source area between the drain area and the via having a source contact, and a gate contact over the via.

9 Claims, 9 Drawing Sheets (51) Int. Cl.
  *H01L 29/66* (2006.01)
  *H01L 23/48* (2006.01)
  *H01L 29/94* (2006.01)
(52) U.S. Cl.
  CPC .... *H01L 29/66734* (2013.01); *H01L 29/7809* (2013.01); *H01L 29/945* (2013.01)

(56) References Cited

U.S. PATENT DOCUMENTS

| | | |
|---|---|---|
| 2002/0093311 A1 | 7/2002 | Stryker et al. |
| 2005/0184326 A1 | 8/2005 | Cheng |
| 2008/0258214 A1* | 10/2008 | Jang .................. H01L 29/66719 257/336 |
| 2009/0095999 A1* | 4/2009 | Jang .................... H01L 29/0653 257/301 |
| 2010/0224965 A1 | 9/2010 | Kuo |
| 2011/0037144 A1 | 2/2011 | Chen et al. |
| 2013/0256792 A1* | 10/2013 | Matsumoto ......... H01L 29/7827 257/334 |
| 2014/0110777 A1 | 4/2014 | Peng et al. |
| 2014/0319600 A1 | 10/2014 | Kothandaraman et al. |

OTHER PUBLICATIONS

International Search Report and Written Opinion for International Patent Application No. PCT/US2015/036797 dated Mar. 17, 2016, 14 pgs.
Search Report for European Patent Application No. 15895835.5 dated Jan. 17, 2019, 7 pgs.
Office Action for Taiwan Patent Application No. 105114725 dated Sep. 9, 2019, 15 pgs., no translation.

* cited by examiner

VERTICAL TRANSISTOR USING A THROUGH SILICON VIA GATE

CROSS-REFERENCE TO RELATED APPLICATION

This patent application is a U.S. National Phase Application under 35 U.S.C. § 371 of International Application No. PCT/US2015/036797, filed Jun. 19, 2015, entitled "VERTICAL TRANSISTOR USING A THROUGH SILICON VIA GATE," which designates the United States of America, the entire disclosure of which is hereby incorporated by reference in its entirety and for all purposes.

FIELD

The present description relates to transistors in semiconductor electronics and, in particular, to a transistor formed in a substrate with a via as a gate.

BACKGROUND

The transistors in semiconductor chip continue to shrink in order to reduce costs, size, and power consumption. As the devices on a chip become smaller, the voltage used to drive the transistors also becomes smaller. While chips from a few years ago operated on 3 to 5 Volts, newer chips operate on 1 Volts or less. This not only reduces the overall power required for the chip but also reduces the amount of power that is lost or wasted by the chip and is converted to heat. Reducing the amount of heat produced by the chip allows the chip's package to be smaller. It also allows the heat fins and air circulation for the chip to be reduced.

In another direction, more circuits are being added to each chip in order to reduce the total number of chips required to build a system. This reduces the size, complexity, and power consumption of the system that houses the chips. With an SOC (System on a Chip), designers strive to put all of the circuitry for a complete system on one chip and in one package. The SOC objective has been reached for some simple devices. For more complex devices there are difficulties putting all of the components on the same type of chip. With an SiP (System in a Package), designers strive to put all of the circuitry for a system in one package. The package contains more than one chip so that different types of circuits may be made using different types of chips. While the chips for an SiP are easier to design and package, it is generally more expensive to make multiple chips than it is to make one chip. It is also more expensive to package several chips together than to package a single chip.

For a true SOC, the chip must include logic and memory circuitry together with power circuitry. For some systems, the chip must also include analog audio amplifiers, baseband radio circuitry, and possibly radio frequency multiplexers, amplifiers and other higher power devices. Low power CMOS (Complementary Metal Oxide Semiconductor) technology is well established for low power logic and memory. The higher power circuits may be made by modifying standard CMOS devices. As examples, there are extended drain devices and lateral drifted channel devices.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

A vertical transistor may be formed using a TSV (Through Silicon Via) as a gate. Such a transistor is particularly well-suited for ultra-high power applications. Using a TSV as the gate electrode and a TSV isolation layer as a gate dielectric provides a large voltage carrying ability in a transistor that is still compatible with CMOS (Complementary Metal Oxide Semiconductor) logic fabrication processes.

A TSV may be designed to withstand high voltages. The voltage carried by a TSV may be increased by increasing the thickness of the TSV isolation liner up to as thick as 100 nm-300 nm. A deep n-well implant may also be used in which the drain may be sharply graded to minimize leakage. In addition, a deep n-well stack may be made with different doping densities. This allows for a large drop in the potential across the n-well before the high voltage is applied to the drain and channel interface.

A vertical transistor around a TSV may also be used as a high voltage guard ring for low voltage transistors in the under layer stacked chips. In a CMOS process in which the logic operates at 1.5V or less, the described vertical transistor may carry voltages greater than 20V. This is made possible in part by using the TSV isolation liner as a thick isolation oxide.

Figure 1:
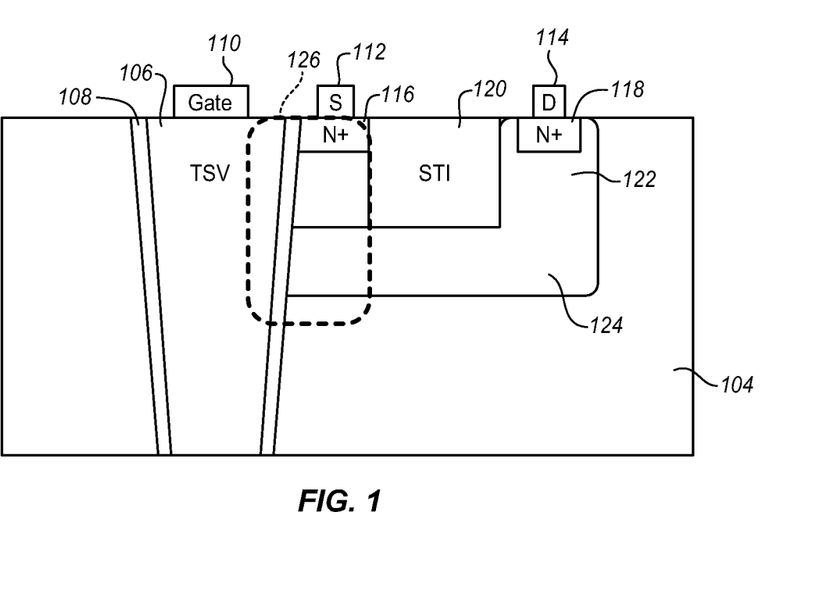
FIG. 1 is a cross-sectional side view diagram of a transistor with a via used as a gate according to an embodiment.

FIG. 1 is a cross-sectional side view diagram of a vertical transistor that is suitable for high power applications such as power supply circuits, amplifiers, and radio or other communications circuits. The vertical transistor in this example is built in a p-type substrate 104. A TSV 106 is formed vertically through the substrate by laser drilling, etching, or in some other way. The hole for the via may be formed by a high aspect ratio deep trench etch down to a e.g. buried oxide (BOX) layer. Alternatively, reactive ion etching may be used.

The via opening is then lined with a thick dielectric 108 that is suitable for the intended voltage. The dielectric may be a silicon dioxide, a silicon nitride, a polymer, another oxide, or a nitride. For a typical CMOS process, a liner with a thickness of 100 nm to 300 nm is able to support over 20V in the via. The via 106 is filled with a conductive material such as copper or another metal or other suitable conductive material. A variety of other metals may be used, depending on the desired chemistry and use of the device. These may include AL, Au, Fe, Ni, Ti, Co, etc. A metal gate 110 is formed over the via. The gate allows for a contact electrode or some other connection to be made to the gate.

In the examples herein, the gate or a whole transistor is referred to as being formed in or surrounding a via. In the example of FIG. 3, the source and drain are surrounding the via. A via, as used herein, is a vertical structure etched, drilled, or bored out of the substrate that is then filled with materials to form the intended structure. The structure may be simply a conductor and dielectric as in FIG. 2 or an entire transistor surrounding the via as in FIG. 3. This is a difference from other transistor structures that are formed by doping surface layers and applying metal over the doped surface layers.

In the illustrated example, a source and drain structure are formed beside the TSV-based gate. In this p-type substrate 104 example, an n-well 122 is formed near the via and a deep n-well 124 is formed laterally from the n-well to the via. Above the deep well, a first n+ drain area 118 is formed in the n-well. A second n+ source area 116 is formed beside the drain area and the n-well. The source and drain areas are isolated by an STI (Shallow Trench Isolation) 120 or other isolation area. A metal source contact 112 is formed over the source area 116 and a metal drain contact 114 is formed over the drain area 118. This forms the completed transistor structure with TSV gate, adjacent source and isolated drain. The source is isolated from the TSV by the TSV dielectric 108.

As shown, the source area 116 is adjacent to the TSV liner 108. Alternatively, there may be a small gap and an additional dielectric layer between the source area and the liner. The drain is isolated from the source area, but the deep n-well creates a channel from the drain, below the source to the gate. This deep well also helps to support higher voltages.

There is a silicon junction area or device channel area 126 between the source 116 and the via 106 that extends from the source area down through the silicon substrate 104 to the deep n-well. The junction area provides a spacing between the source and the via. This silicon junction area is deeper than for a normal logic transistor so that it creates a larger barrier for leakage current. In order to further reduce any leakage current, the doping level of the junction area may be gradually increased or graded from the source area to the deep n-well.

Figure 2:
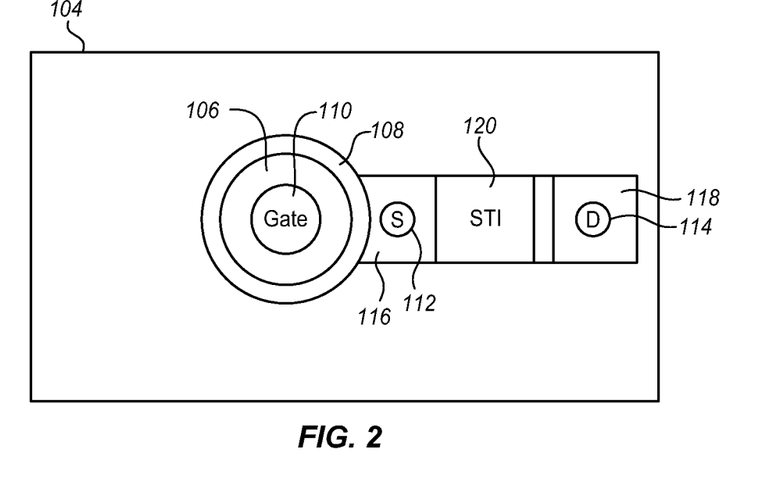
FIG. 2 is a top view diagram of the transistor of FIG. 1 according to an embodiment.
Figure 3:
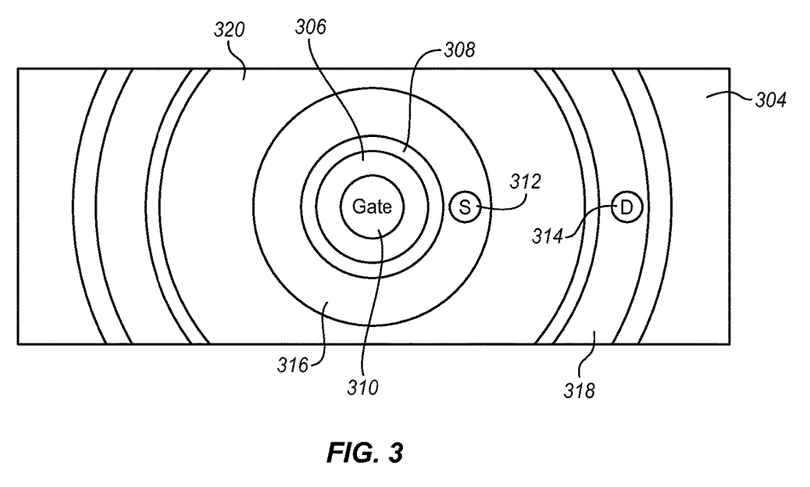
FIG. 3 is a top view diagram of an alternative circular transistor with a via used as a gate according to an embodiment.

FIG. 2 is a top plan view of the vertical transistor of FIG. 1 showing a circular top surface of a cylindrical via 106 with a concentric outer liner 108. The gate 110 is centered in the via and also has a circular top surface concentric with the outer liner, however, it may be formed in any other desired shape.

As shown, the source 112 is adjacent to the via 106 and positioned in direct contact with the lining 110. The source is placed on one side of the via and the rest of the transistor structure extends from the source in the same direction as the source. In this example, the source is shown extending from the right side of the via. The STI 120 is to the right of the source and the drain 118 is to the right of the STI. The n-well extends from the drain to the via but is not visible in this view. The source and drain portion of the transistor structure is rectangular and extends linearly away from the TSV. The TSV has a diameter that is greater than the width of the source and drain structures so that it extends on either side of the source area 116. The particular relative dimensions of the via, source, and drain may be adapted to suit the desired performance characteristics.

This circular and concentric configuration is simple to visualize and illustrate. The circular and concentric aspects of this structure are also easy to fabricate using existing etching, doping and filling technologies. However, other shapes may be used instead. The via is not necessarily round, but may be oblong, elliptical, or in the shape of a rounded polygon. The source and drain may also have more curved shapes, depending on the fabrication technologies and the desired performance characteristics.

FIG. 3 is a top plan view of an alternative concentric configuration to the structure of FIGS. 1 and 2. This top view shows circular structures, however, each of the structures have a depth extending into the page so that the structures are cylindrical or conical. A TSV 306 is formed in the center of the device with a gate contact 310. The gate contact is shown as circular and centered in the TSV, however, it may be any desired shape and location. The TSV has a concentric outer line 308 in the form of a dielectric layer on the inner surface of the TSV. The TSV is surrounded by a concentric n+-well doped source area 316. The source area has a source contact 312 on the source area. As shown, a single source contact is placed on one side of the source area to the right of the TSV. There may also be additional contacts that are joined together with a wiring layer.

A concentric cylindrical STI area 320 surrounds the source area to isolate the source area. An n+ well doped drain area 318 is concentric with and surrounds the STI area. The drain area, like the source area has a single drain contact 314 aligned with the source contact for ease of making the connections. However, there may be more drain contacts and the source and drain contacts may be placed in different locations, depending on the implementation. Beyond the drain area, the silicon substrate 304 is shown. Each of these circular structures is concentric with and surrounds the neighboring structure. The relative sizes of the structures may be modified to suit different performance objectives. In addition, the areas may be modified so that they do not share a common center or so that some or all of the areas are not circular. Elliptical, oblong, rectangular and other shapes may be used. The structure also includes an n-well and a deep n-well as described above, however, these are not visible in the top view.

The concentric structure of the TSV 306 and STI area 320 allow the STI to carry a much higher voltage. For many typical dimensions and fabrication technologies, this voltage may be much higher than the typical 20V because the size of the device is maximized. At the same time, the concentric structure significantly increases the width of the effective device and therefore its drive current. The concentric structure also provides better channel control.

Figure 4:
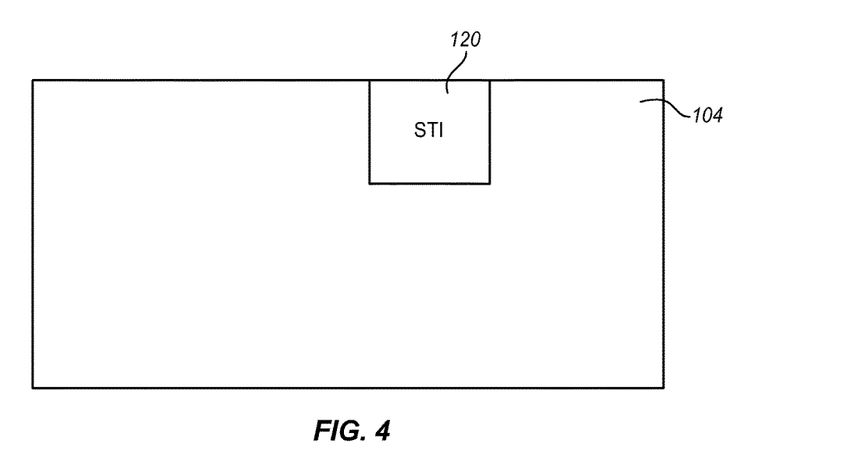
FIGS. 4-10 are side cross-sectional view diagrams of fabrication stages for the transistor of FIG. 1 according to an embodiment.
Figure 5:
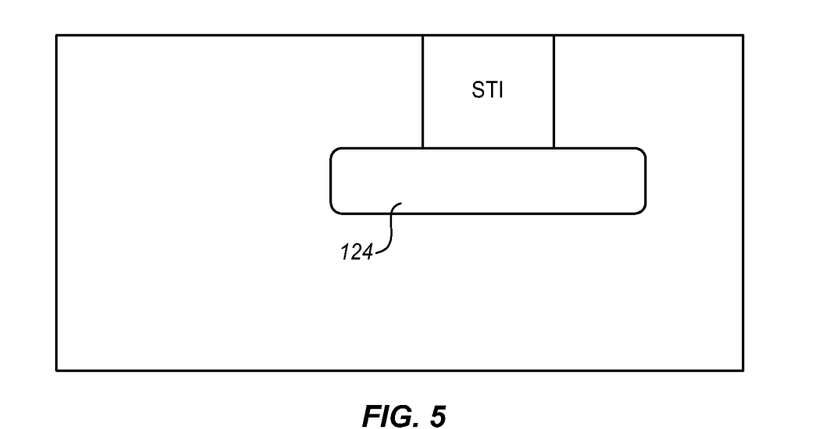
Figure 6:
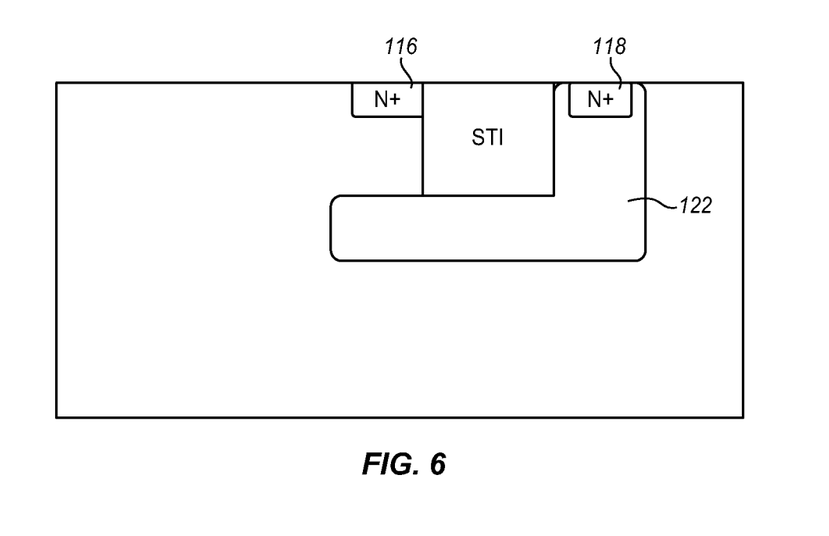

FIGS. 4-10 show fabrication stages for producing a vertical transistor structure as shown in FIG. 1. FIG. 4 is a side cross-sectional view of a p-type silicon substrate 104. An STI structure is formed in the substrate by plasma ion deposition. In FIG. 5, a deep n-well 124 is formed in the p-type substrate 104 below the STI layer 120 by ion implantation. In FIG. 6, an n-well 122 is formed in the p-type substrate on one side of and over the deep n-well 124. In addition, the n+-doped source and drain areas 116, 118 are formed. The drain area is formed in the n-well and the source area is formed on the opposite side of the STI above the deep n-well. The doped areas may all be formed by dopant implant using photolithography to control the size and shape of the doped and STI areas.

Figure 7:
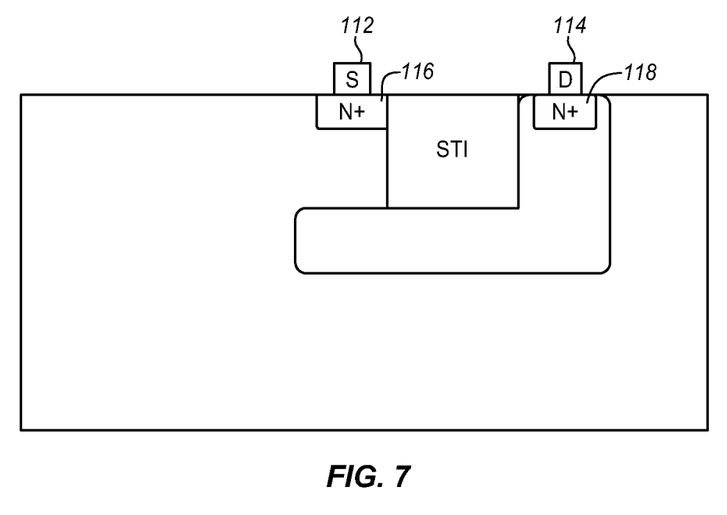
Figure 8:
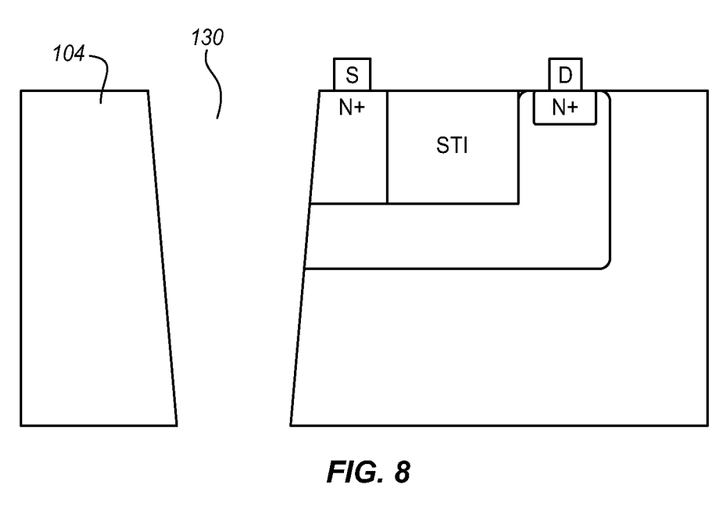

In FIG. 7 source and drain contacts 112, 114 are formed over the source and drain areas 116, 118, respectively. The contacts may be formed as aluminum wiring by deposition or dispensing. In FIG. 8 a TSV 130 is etched through the p-substrate 104 by etching. The TSV is beside the source area and the deep n-well and may contact or cut through a portion of these structures to ensure a connection.

Figure 9:
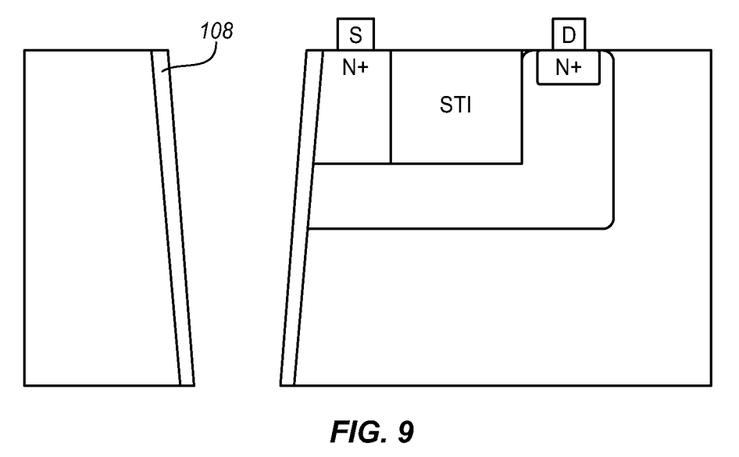
Figure 10:
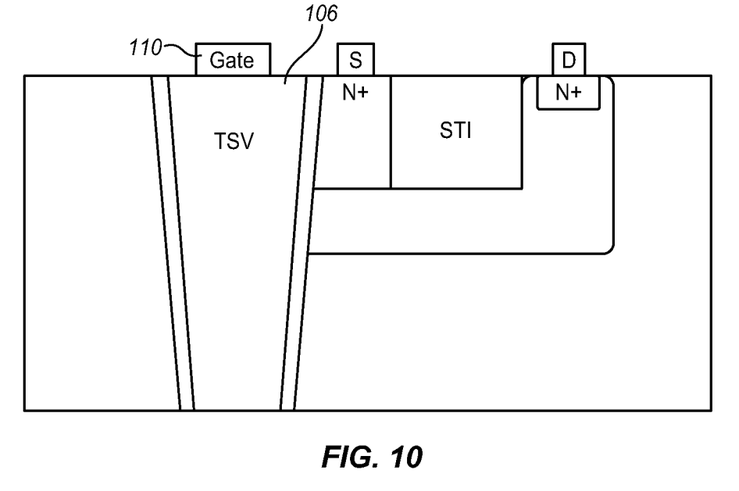

In FIG. 9 the via is lined with a dielectric layer 108 such as an oxide. In FIG. 10, the via is filled with a conductive material such as copper or aluminum and a gate 110 is formed over the via. The gate may be formed in the same way as the source and drain contacts, such as by aluminum deposition or in any other way. This completes the vertical transistor as shown in FIGS. 1 and 2. A similar approach may be used to form the vertical transistor of FIG. 3. The device may then be finished with any other desired components such as dielectric layers, wiring layers, interlayer dielectrics, etc. Additional components may be formed over the vertical transistor depending on the particular implementation.

While an NMOS (n-type Metal Oxide Semiconductor) transistor in a p-type substrate is described. The techniques described herein may be adapted to construct a PMOS (p-type Metal Oxide Semiconductor) transistor instead. As an example an additional n-well implant operation may be performed before the STI formation or before etching the via. The relative sizes of the layers and components may be adapted to suit different uses of the vertical transistors. The drawings herein are not to scale.

Figure 11:
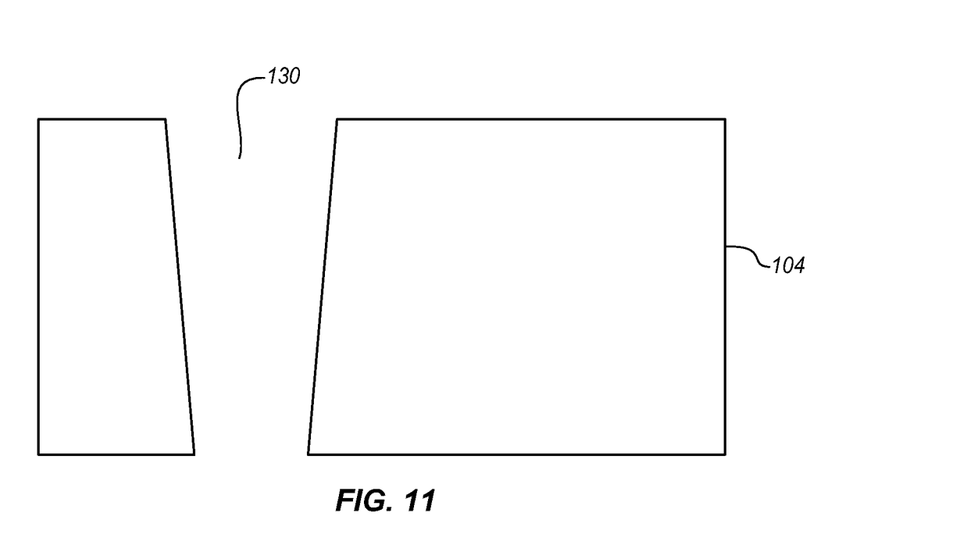
FIGS. 11-16 are side cross-sectional view diagrams of alternative fabrication stages for the transistor of FIG. 1 according to an embodiment.
Figure 12:
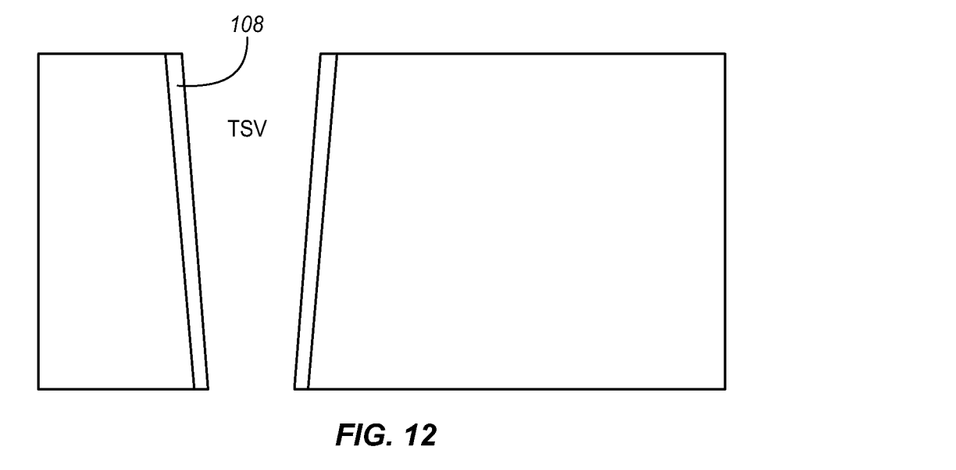
Figure 13:
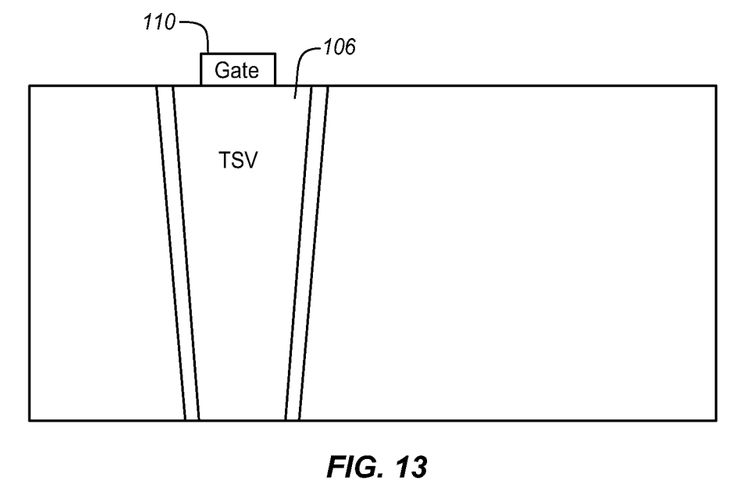

FIGS. 11-16 show an alternative sequence of fabrication stages for producing a vertical transistor as shown in FIG. 1. FIG. 11 is a cross-sectional side view diagram of the p-type substrate 104. Instead of first forming the transistor well, in this case, the via is formed first. The via 130 may be etched as described above or formed in another way such as by laser drilling. In FIG. 12, the walls of the via are coated with a dielectric liner such as an oxide. In FIG. 13, the via 130 is finished by filling with e.g. copper and forming a gate over the top of the via. The gate may be metal, such as aluminum or made of another material. Alternatively, the gate may be formed in a separate operation such as at the time that the contacts are formed over the source and drain.

Figure 14:
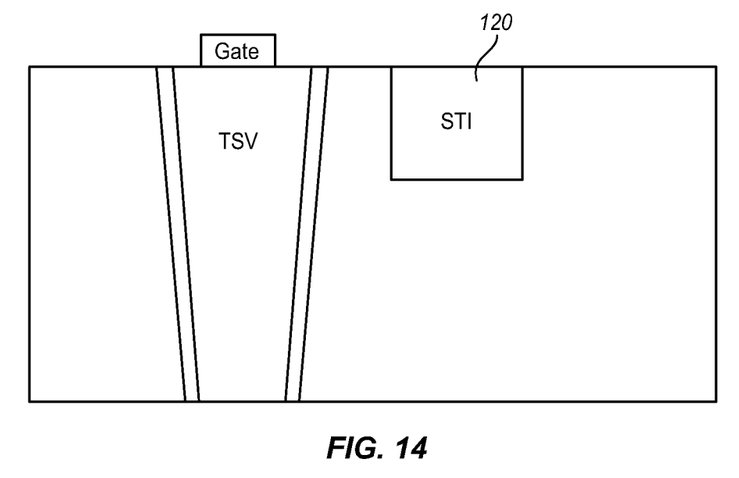
Figure 15:
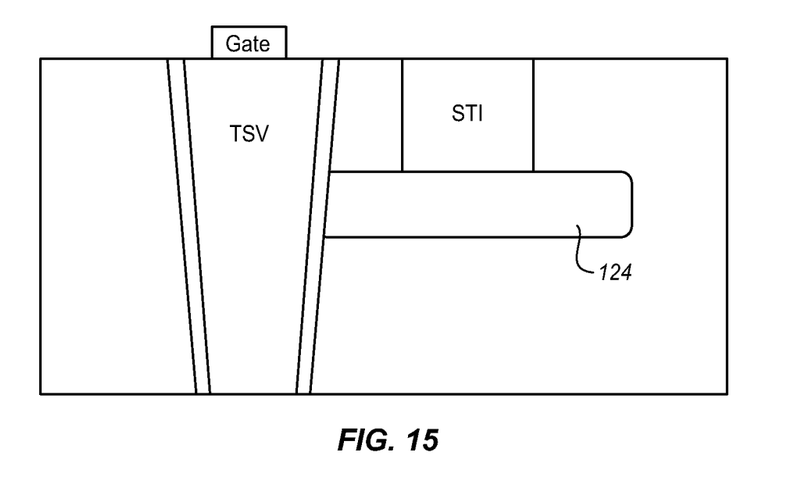

In FIG. 14 an STI layer 120 is formed beside the TSV 106 in the p-substrate. The STI layer is spaced from the TSV with enough room to allow for a source area to later be added. In FIG. 15, a deep n-well 124 is formed below and across the STI layer by implanting the substrate. The deep well abuts the TSV and extends in the opposite direction past the STI layer.

Figure 16:
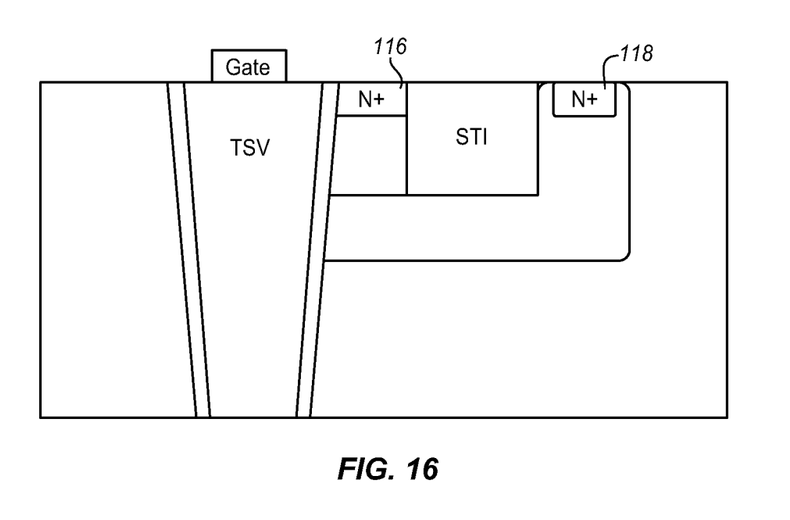

In FIG. 16, the other doped areas are formed. This includes the regular n-well 122 for the drain which is in contact with the deep n-well on one side of the STI. It also includes n+ doped areas 116, 118 for the source and the drain on either side of the STI layer and formed as described above.

The configuration of FIG. 16 may be processed to the same configuration as in FIG. 10 by adding gate contacts and other appropriate formations. As mentioned above, additional layers, contacts, electrodes, and structures may be added to the configuration of FIG. 10. Additional components may be formed above, below and beside the vertical transistor. The vertical transistor may be formed in NMOS, as shown, or in PMOS, depending on the particular implementation.

As described a deep TSV and deep well implant are combined to form a vertical high voltage device. The TSV is isolated with a surrounding dielectric liner. The deep well implant forms the junction for the transistor. The device may be formed as shown in a CMOS process. The same approach may be used for a FinFET process. While the examples herein show only simple transistors, other structures may be shown such as diodes, triodes, and multiple gate devices using the same principles.

Figure 17:
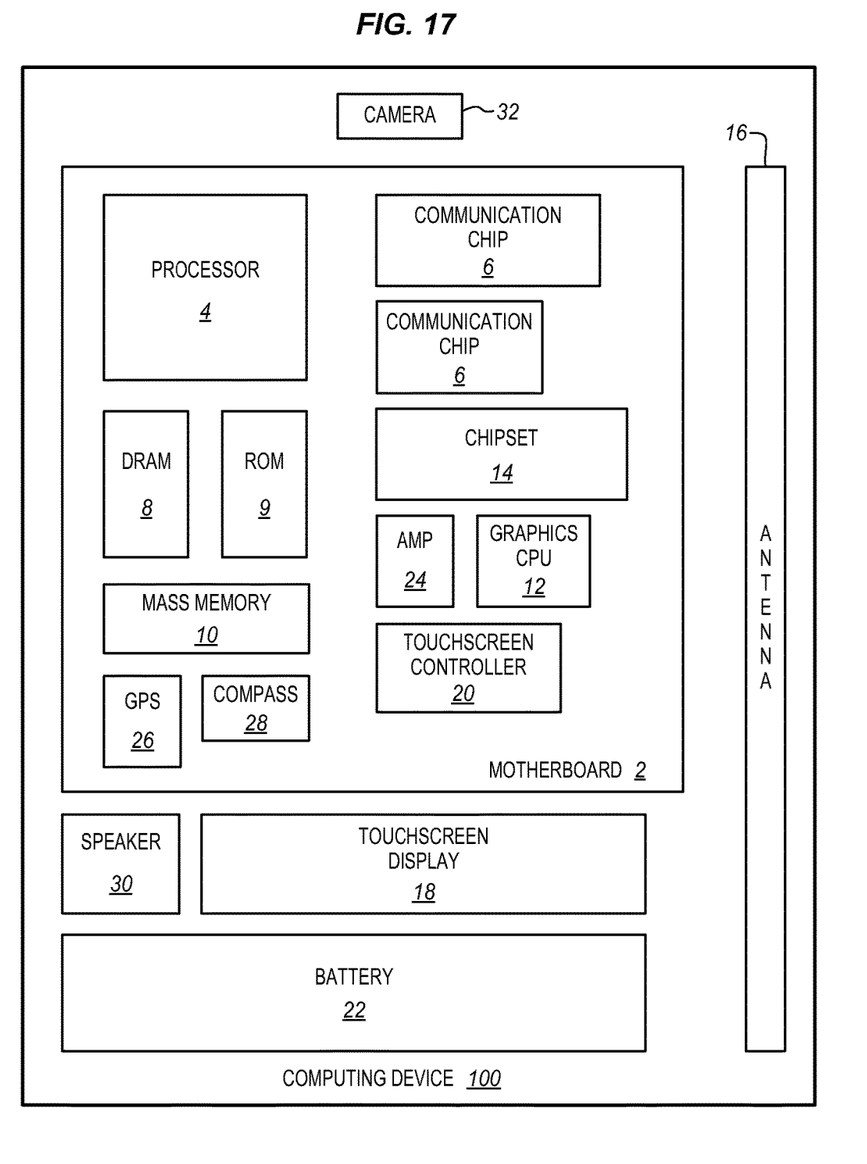
FIG. 17 is a block diagram of a computing device incorporating a tested semiconductor die according to an embodiment.

FIG. 17 illustrates a computing device 11 in accordance with one implementation. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, the integrated circuit die of the processor, memory devices, communication devices, or other components are fabricated to include vertical transistors or transistors using a via as a gate as described herein. One or more of the illustrated components may be combined to form an SOC as described herein. The described vertical transistors may be used for amplifiers, power supply systems, radio frequency components in a CMOS or other low power die. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a the structure that includes a substrate, a via in the substrate, the via being filled with a conductive material and having a dielectric liner, a deep well coupled to the via, a drain area coupled to the deep well having a drain contact, a source area between the drain area and the via having a source contact, and a gate contact over the via.

In further embodiments the via is copper filled.

In further embodiments the deep well and the source area are adjacent to the via.

Further embodiments include a silicon junction area between the source area and the deep well.

In further embodiments the silicon junction area is graded to minimize leakage.

Further embodiments include an isolation layer above the deep well and between the source area and the drain area.

In further embodiments the drain area is coupled to the deep well through a well extending from the drain to the deep well.

In further embodiments the well is an n-well, the deep well is an n-well, and the substrate is a p-type silicon substrate.

In further embodiments the source area surrounds the via and the drain area surrounds the source area.

In further embodiments the dielectric liner, the source area, and the drain area are concentric.

Further embodiments include shallow trench isolation areas between the source area and the drain area and concentric with the dielectric liner.

Some embodiments pertain to a method that includes forming an isolation layer in a silicon substrate, forming a deep well below the isolation area, forming a drain area coupled to the deep well, forming a source area over the deep well, forming a drain contact over the drain area, forming a source contact over the source area, forming a vertical opening in the substrate adjacent to the source area, lining the opening with a dielectric liner, filling the opening with a conductive material to form a through silicon via, and forming a gate contact over the via.

In further embodiments the deep well extends to the via, the method further comprising forming a silicon junction area between the source area and the deep well.

In further embodiments the drain area is coupled to the deep well through a well extending from the drain to the deep well.

In further embodiments the source area surrounds the via and the drain area surrounds the source area.

In further embodiments the dielectric liner, the source area, and the drain area are concentric.

Further embodiments include shallow trench isolation areas between the source area and the drain area and concentric with the dielectric liner.

Some embodiments pertain to a computing system that includes a system board, a memory connected to the system board, and a processor coupled to the memory through the system board, the processor being formed on a substrate and having a plurality of transistors, at least one transistor having, a via in the substrate, the via being filled with a conductive material and having a dielectric liner, a deep well coupled to the via, a drain area coupled to the deep well having a drain contact, a source area between the drain area and the via having a source contact, and a gate contact over the via.

Further embodiments include a silicon junction area with a graded doping between the source area and the deep well.

In further embodiments the source area surrounds the via and the drain area surrounds the source area and wherein the dielectric liner, the source area, and the drain area are concentric.

The invention claimed is:

1. An apparatus comprising: a substrate; a via in the substrate, the via being filled with a conductive material and having a dielectric liner; a deep well coupled to the via, wherein the via extends deeper into the substrate than the deep well; a drain area; coupled to the deep well having a drain contact; a source area between the drain area and the via having a source contact; a gate contact over the via; and an isolation layer above the deep well and between the source area and the drain area, the isolation layer further in direct contact with the deep well and the source area.

2. The apparatus of claim 1, wherein the via is copper filled.

3. The apparatus of claim 1, wherein the deep well and the source area are adjacent to the via.

4. The apparatus of claim 1, further comprising a silicon junction area between the source area and the deep well.

5. The apparatus of claim 4, wherein the silicon junction area is graded to minimize leakage.

6. The apparatus of claim 1, wherein the drain area is coupled to the deep well through a well extending from the drain to the deep well.

7. The apparatus of claim 6, wherein the well is an n-well, the deep well is an n-well, and the substrate is a p-type silicon substrate.

8. The apparatus of claim 1, wherein the source area surrounds the via and the drain area surrounds the source area.

9. The apparatus of claim 8, wherein the source area and the drain area are concentric.

* * * * *